US007019381B2

(12) United States Patent
Smith et al.

(10) Patent No.: US 7,019,381 B2

(45) Date of Patent: Mar. 28, 2006

(54) METHOD OF PROVIDING MULTIPLE LOGICAL BITS PER MEMORY CELL

(75) Inventors: Kenneth K. Smith, Boise, ID (US); Sarah M. Brandenberger, Boise, ID (US); Darrel R. Bloomquist, deceased, late of Meridian, ID (US); by Judy Bloomquist, legal representative, Meridian, ID (US); Kenneth J. Eldredge, Boise, ID (US); Andrew L. Van Brocklin, Corvallis, OR (US); Peter J. Fricke, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 28 days.

(21) Appl. No.: 10/611,544

(22) Filed: Jul. 1, 2003

(65) Prior Publication Data

US 2004/0002193 A1 Jan. 1, 2004

Related U.S. Application Data

(62) Division of application No. 10/120,113, filed on Apr. 9, 2002, now Pat. No. 6,625,055.

(51) Int. Cl.
*H01L 29/00* (2006.01)

(52) U.S. Cl. ...................... 257/536; 257/528; 257/537

(58) Field of Classification Search ................ 438/381, 438/382, 3, 528, 536; 257/528, 536, 537
See application file for complete search history.

(56) References Cited

U.S. PATENT DOCUMENTS

| | | | | |
|---|---|---|---|---|
| 4,162,538 | A | 7/1979 | Thornburg | |
| 5,640,343 | A | 6/1997 | Gallagher et al. | |
| 5,840,608 | A | 11/1998 | Chang | |
| 5,847,442 | A | 12/1998 | Mills, Jr. et al. | |
| 5,978,257 | A | 11/1999 | Zhu et al. | |
| 5,982,659 | A | 11/1999 | Irrinki et al. | |
| 6,114,719 | A * | 9/2000 | Dill et al. | 257/295 |
| 6,128,239 | A | 10/2000 | Perner | |
| 6,185,143 | B1 | 2/2001 | Perner | |
| 6,188,615 | B1 | 2/2001 | Perner et al. | |
| 6,215,140 | B1 | 4/2001 | Reisinger et al. | |
| 6,314,014 | B1 * | 11/2001 | Lowrey et al. | 365/100 |
| 6,351,406 | B1 | 2/2002 | Johnson et al. | |
| 6,380,597 | B1 | 4/2002 | Gudesen et al. | |
| 6,417,043 | B1 | 7/2002 | Risch et al. | |
| 6,458,676 | B1 | 10/2002 | Mills, Jr. | |
| 6,504,750 | B1 | 1/2003 | Baker | |
| 6,542,397 | B1 | 4/2003 | Mills, Jr. | |
| 2003/0043616 | A1 | 3/2003 | Baker | |
| 2003/0122170 | A1 * | 7/2003 | Apodaca et al. | 257/295 |
| 2004/0090815 | A1 * | 5/2004 | Tajiri | 365/148 |
| 2005/0083757 | A1 * | 4/2005 | Hsu et al. | 365/222 |

* cited by examiner

*Primary Examiner*—Bradley K. Smith

(57) ABSTRACT

A semiconductor substrate is provided over which electrically conductive columns are formed along with electrically conductive rows crossing over the electrically conductive columns. A plurality of memory components are formed each having a resistance value corresponding to multiple logical bits and non-volatile memory cells are each formed by connecting a memory component between an electrically conductive row and an electrically conductive column.

17 Claims, 7 Drawing Sheets

METHOD OF PROVIDING MULTIPLE LOGICAL BITS PER MEMORY CELL

RELATED APPLICATION

This application is a divisional of U.S. patent application Ser. No. 10/120,113 filed Apr. 9, 2002, now U.S. Pat. No. 6,625.055.

TECHNICAL FIELD

This invention relates to memory devices and, in particular, to a non-volatile, multi-level memory device having multiple logical bits per memory cell.

BACKGROUND

Conventional read-only memory (ROM) circuits are implemented as special-purpose integrated circuits for the permanent storage of program instructions and data. For example, a ROM circuit can be manufactured with specific instructions for the operation of a computer system.

Typically, a ROM circuit consists of an array of memory cells on a semiconductor, and each memory cell has a transistor that is fabricated to indicate a "one" or "zero" based on how the semiconductor is implanted to create the transistor. The data is permanently stored with a memory cell, and it cannot then be erased or altered electrically. Each of the transistors can be formed so as to have one of the two predetermined values. Additionally, a ROM circuit is fabricated as a single level device, where the array of memory cells are formed adjacent to each other over a semiconductor substrate.

A programmable ROM (PROM) circuit is designed to be programmed after the semiconductor chip has been manufactured. The memory cells of a PROM device are programmed with data (e.g., a "one" or a "zero") when the instructions are burned into the chip. A mask ROM is encoded by selectively programming a threshold voltage level of each memory cell transistor in an array of transistors to one or two or more predetermined levels. This is accomplished by forming contacts that define the threshold voltage levels near the end of the manufacturing process. When a PROM device is programmed, the device can be implemented like a conventional ROM chip in that the data cannot be electrically altered.

Due to the costs of fabricating semiconductor devices, and the design of smaller integrated circuit-based electronic devices, there is an ever-present need to provide non-volatile memory circuits that take up less space, have improved memory storage capacity, and are inexpensive to manufacture.

SUMMARY

Multiple logical bits per memory cell in a memory device is described herein.

In an implementation, a semiconductor substrate is provided over which electrically conductive columns are formed along with electrically conductive rows crossing over the electrically conductive columns. A plurality of memory components are formed each having a resistance value corresponding to multiple logical bits and non-volatile memory cells are each formed by connecting a memory component between an electrically conductive row and an electrically conductive column.

BRIEF DESCRIPTION OF THE DRAWINGS

The same numbers are used throughout the drawings to reference like features and components.

DETAILED DESCRIPTION

The following describes a non-volatile, multi-level memory device having multiple logical bits per memory cell, and methods for making such a memory device. A multi-level read-only memory (ROM) device having multiple logical bits per memory cell takes up less space than a conventional ROM device, yet provides more memory capacity. A multi-level ROM device can be utilized in small electronic devices and accommodates requests for smaller memory devices. Additionally, a memory device fabricated with memory cells having resistors, rather than conventional transistor based memory cells, is less expensive to manufacture. Less expensive and smaller memory devices provide greater design flexibility for integrated circuit-based electronic devices.

Figure 1A:
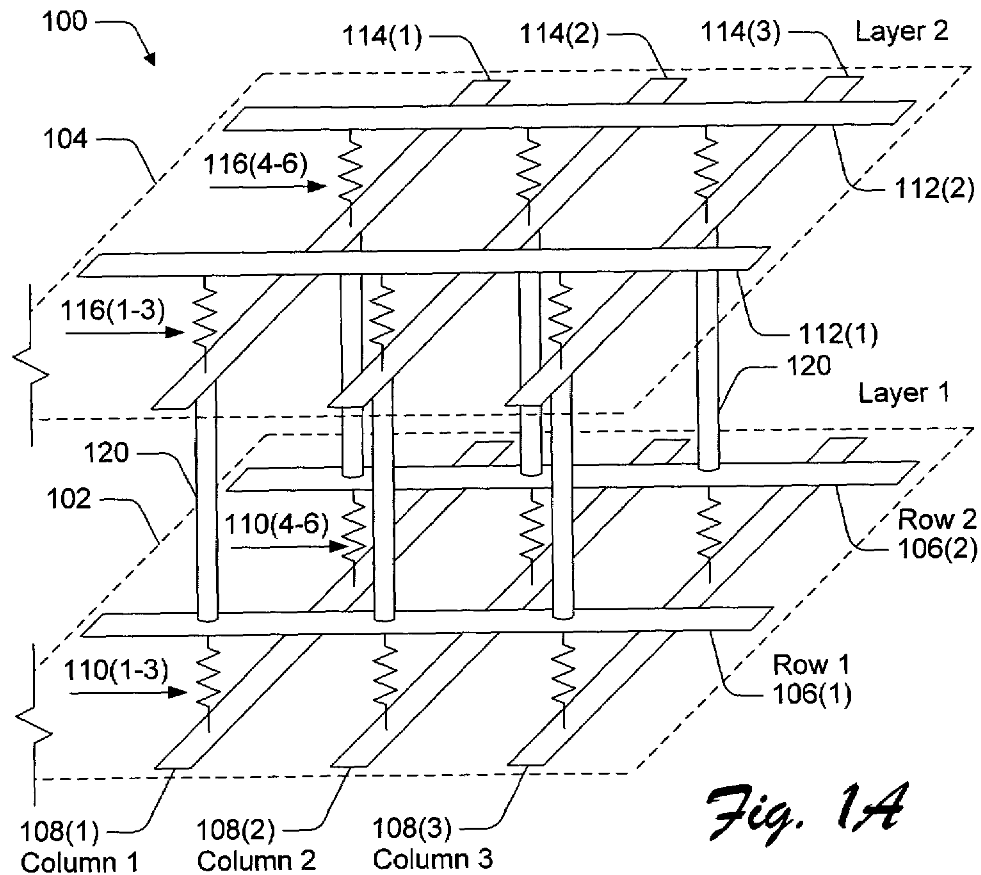
FIGS. 1A and 1B illustrate schematics of a non-volatile, multi-level memory device.
Figure 1B:
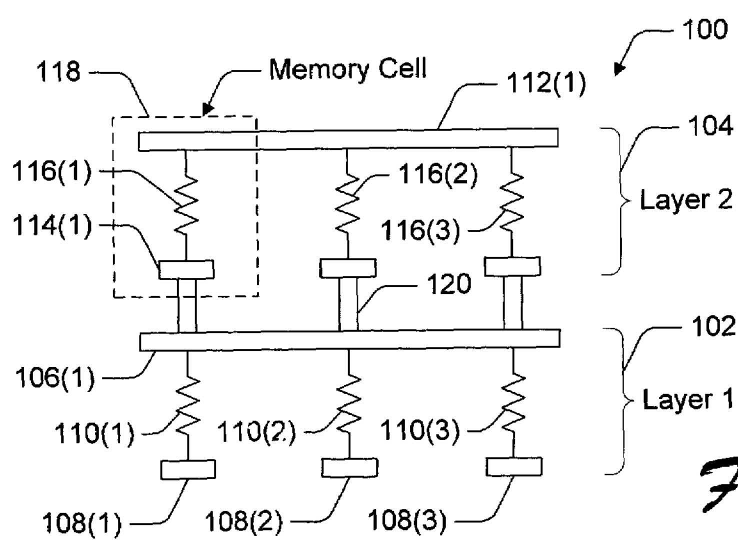

FIGS. 1A and 1B are schematics of a non-volatile, multi-level read-only memory (ROM) device 100. The schematics illustrate memory device 100 having two layers, a first layer 102 and a second layer 104. The first layer 102 of memory device 100 has conductive traces that are formed as rows of conductive material 106(1–2) crossing over columns of conductive material 108(1–3).

The first layer 102 also has memory components 110(1–6) illustrated as resistors in the schematic. Each memory component 110 is connected between a row of conductive material and a column of conductive material. For example, memory component 110(1) is connected between the row of conductive material 106(1) and the column of conductive material 108(1).

Similarly, the second layer 104 has conductive traces that are formed as rows of conductive material 112(1–2) crossing over columns of conductive material 114(1–3). Memory components 116(1–6) are connected between a row of conductive material and a column of conductive material, which is designated as a memory cell. For example, memory cell 118 includes a memory component 116(1) connected between the row of conductive material 112(1) and the column of conductive material 114(1).

The memory cells of the first layer 102 and the memory cells of the second layer 104 are electrically insulated with a non-conductive material 120. Although shown in the schematic as individual insulators 120 between memory cells, the non-conductive material 120 can be formed as a solid layer between the first layer 102 and the second layer 104.

To simplify the description, FIGS. 1A and 1B show only two layers of memory device 100 and only a few memory cells per layer that include a memory component between, or at a cross point, of a row conductive trace and a column conductive trace. Those skilled in the art will appreciate that the memory device 100 can be fabricated with any number of layers, and with any number of memory cells per layer to accommodate requests for smaller memory devices that provide more memory capacity.

Figure 2:
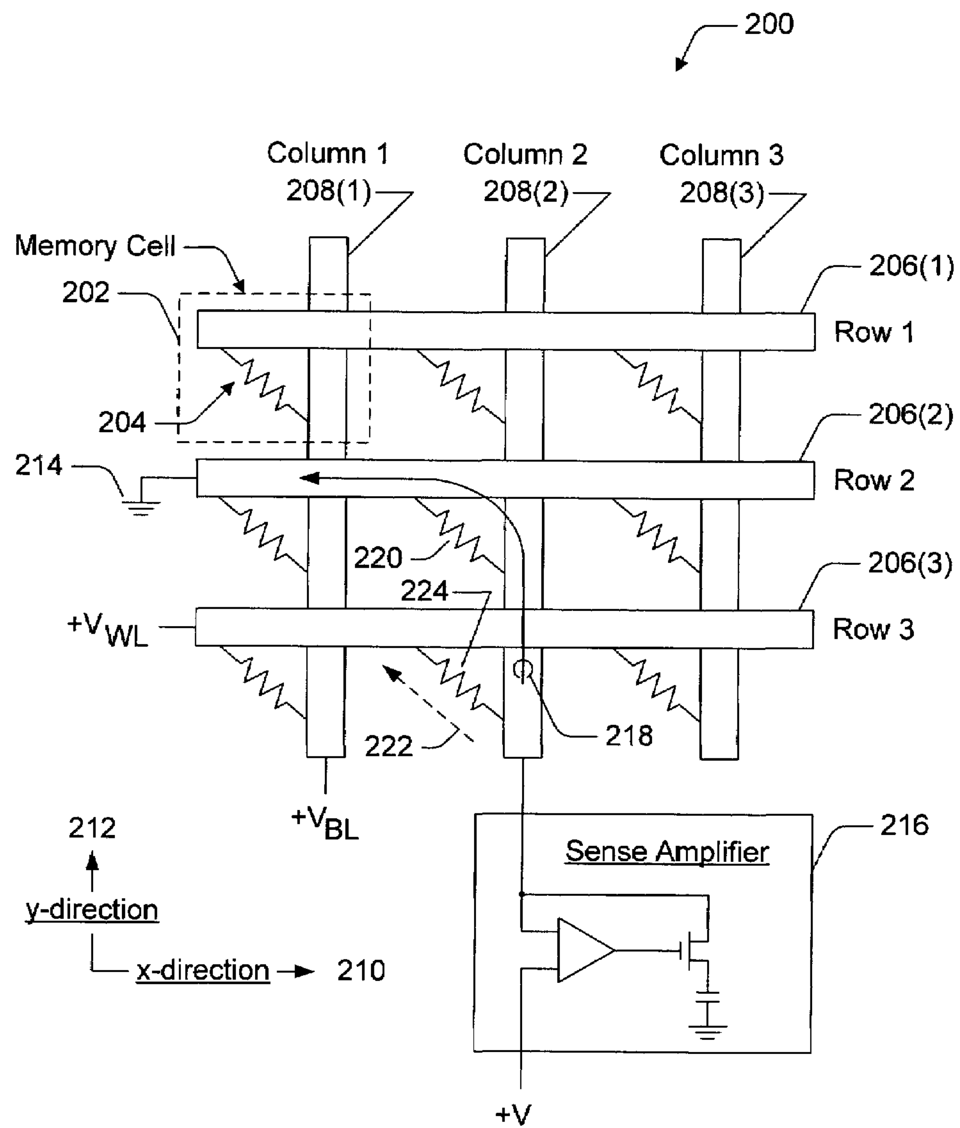
FIG. 2 illustrates a circuit diagram of a non-volatile memory array having memory cells that include a resistor.

FIG. 2 is a circuit diagram of a memory array 200 that represents one layer of a non-volatile, multi-level ROM device. An individual memory cell 202 has a resistor 204 memory component that is connected between a row of conductive material 206(1) and a column of conductive material 208(1).

The memory cells (i.e., a memory component connected between conductive traces) are arranged in rows extending along an x-direction 210 and in columns extending along a y-direction 212. Any additional layers of a ROM device would extend in the z-direction. Only a few memory cells are shown to simplify the description. In practice, a ROM device having multiple memory cell arrays 200 can be used. Additionally, the rows of conductive material 206 and the columns of conductive material 208 do not have to be fabricated perpendicular to each other. Those skilled in the art will recognize the various fabrication techniques and semiconductor design layouts that can be implemented to fabricate the memory array 200.

The rows of conductive material 206 are traces that function as word lines extending along the x-direction 210 in the memory array 200. The columns of conductive material 208 are traces that function as bit lines extending along the y-direction 212 in the memory array 200. There can be one word line for each row of the array and one bit line for each column of the array. Each memory cell is located at a cross point of a corresponding word line and bit line.

Each memory cell has a memory component (e.g., the resistors in FIG. 2) that has a determinable resistance value when a potential is applied to the memory component. A memory cell indicates multiple logical bits that correspond to the determinable resistance value of a memory component in the memory cell. Memory array 200 can be fabricated with memory components having varying resistance values, where each resistance value corresponds to different multiple logical bits. For example, memory array 200 can have resistance values generally in the range of the following, that correspond to logical bits as follows:

| Approximate Resistance Values | Logical Bits |
|---|---|
| 150K ohms | 00 (zero-zero) |
| 250K ohms | 01 (zero-one) |
| 350K ohms | 10 (one-zero) |
| 450K ohms | 11 (one-one) |

The approximate resistance values are provided merely as an example of varying resistance values. In practice, each set of logical bits can correspond to a defined range of resistance values. For example, logical bits 00 (zero-zero) can correspond to a range of resistance values from 120 K ohms to 180 K ohms, where the 150 K ohm resistance value is a target value for circuit design considerations. Similarly, the other approximate resistance values can be defined as a range of resistance values.

Rather than defining two bits with two memory components in conventional ROM structures, two bits can be defined with a single memory component which doubles the memory capacity of the memory array. Those skilled in the art will recognize that memory array 200 can be fabricated with any number of resistors, each having a corresponding resistance value that can be correlated to a multiple logical bit value. For example, implementing memory array 200 with eight varying resistance values can provide a resolution of three logical bit values per resistance value (i.e., 000 to 111).

The resistance state of a selected memory cell can be sensed by applying a voltage to the memory cell and measuring the current that flows through the memory component in the memory cell. The resistance value is proportional to the sense current. During a read operation to determine the resistance value of a memory component in a memory cell, a row decoder (not shown) selects a word line 206(2) by connecting the word line to ground 214. A column decoder (not shown) selects a bit line 208(2) to be connected to a sense amplifier 216 that applies a positive voltage, identified as +V, to the bit line 208(2). The sense amplifier 216 senses the different resistance values of memory components in selected memory cells in the memory array 200.

All of the other unselected word lines (i.e., rows 206) are connected to a constant voltage source, identified as $+V_{WL}$, which is equivalent to the positive voltage +V. Additionally, all of the other unselected bit lines (i.e., columns 208) are connected to a constant voltage source, identified as $+V_{BL}$, which is also equivalent to the positive voltage +V. The constant voltage sources $+V_{WL}$ and $+V_{BL}$ can be supplied from an external circuit, or circuits.

In a non-volatile, multi-level memory array, the memory cells on a particular layer are coupled together through parallel paths. Applying equal potentials to the selected and unselected word and bit lines reduces parasitic currents. For example, a signal current 218 flows through resistor 220 when determining the resistance value of the memory component. If the equipotential voltage $+V_{WL}$ applied to row 206(3) is less than selection voltage +V, an unwanted parasitic current 222 will flow through resistor 224.

The sense amplifier 216 can be implemented with sense amplifiers that include a differential, analog, or digital sense amplifier. Implementing a differential sense amplifier with a memory device is described in a U.S. Pat. No. 6,185,143 B1 to Perner et al. Implementing an analog sense amplifier with a memory device is described in a U.S. Pat. No. 6,128,239 to Perner. Implementing a digital sense amplifier with a memory device is described in a U.S. Pat. No. 6,188,615 B1 to Perner et al. All of the patents to Perner are assigned to the Hewleft-Packard Company.

Figure 3:
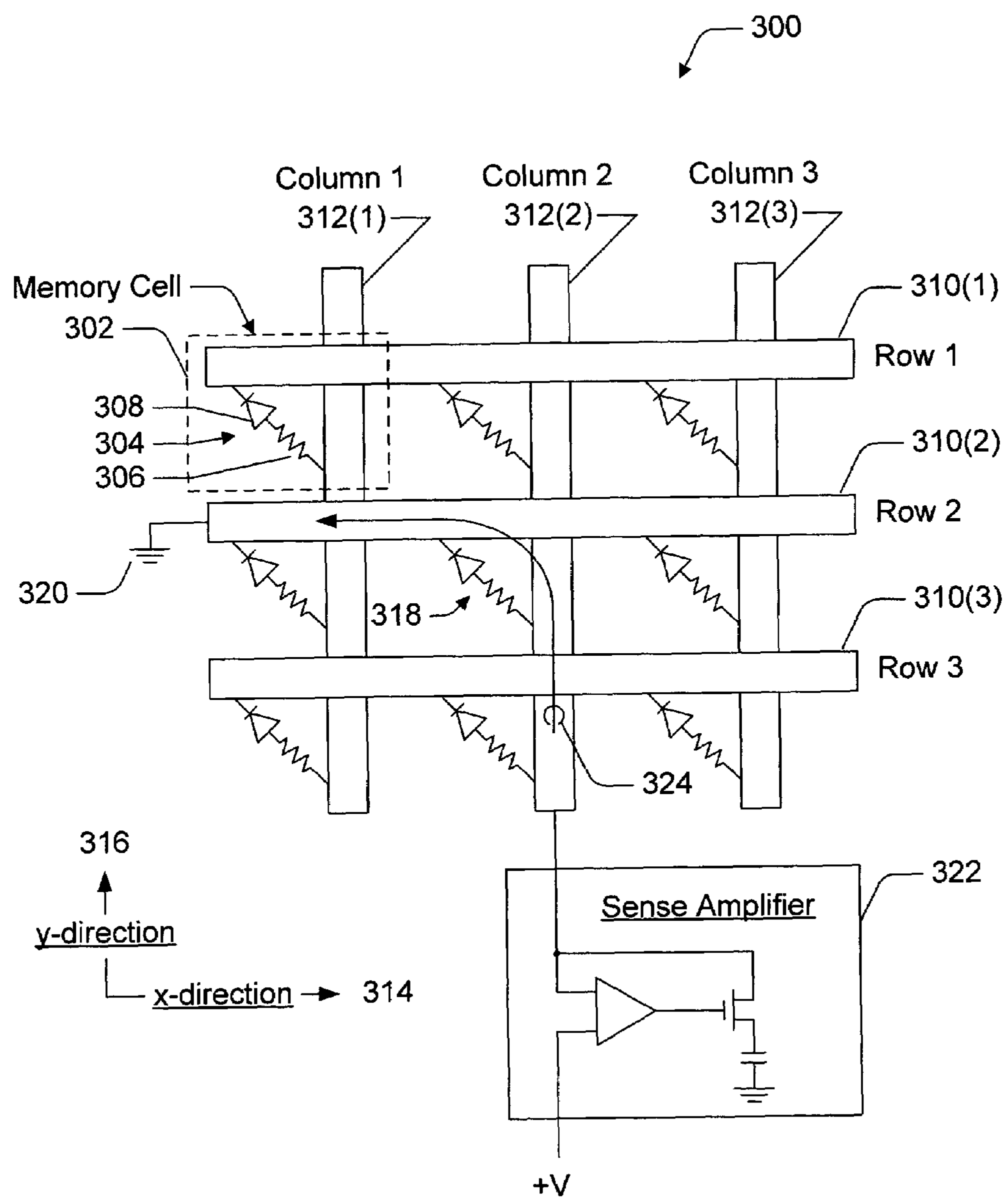
FIG. 3 illustrates a circuit diagram of a non-volatile memory array having memory cells that include a resistor in series with a diode.

FIG. 3 is a circuit diagram of a memory array 300 that represents one layer of a non-volatile, multi-level ROM device. An individual memory cell 302 has a memory component 304 that is formed with a resistor 306 connected in series with a diode 308. The memory component 304 is connected between a row of conductive material 310(1) and a column of conductive material 312(1).

The memory cells (i.e., a memory component connected between conductive traces) are arranged in rows extending along an x-direction 314 and in columns extending along a y-direction 316. Any additional layers of a ROM device would extend in the z-direction. Only a few memory cells are shown to simplify the description. In practice, a ROM device having multiple memory cell arrays 300 can be used. Additionally, the rows of conductive material 310 and the columns of conductive material 312 do not have to be fabricated perpendicular to each other. Those skilled in the art will recognize the various fabrication techniques and semiconductor design layouts that can be implemented to fabricate the memory array 300.

The rows of conductive material 310 are traces that function as word lines extending along the x-direction 314 in the memory array 300. The columns of conductive material 312 are traces that function as bit lines extending along the y-direction 316 in the memory array 300. There can be one word line for each row of the array and one bit line for each column of the array. Each memory cell is located at a cross point of a corresponding word line and bit line, where a memory cell stores a bit of information which translates to a logical one, or a logical zero.

The resistance state of a selected memory cell can be sensed by applying a voltage to the memory cell and measuring the current that flows through the memory component in the memory cell. For example, to determine the resistance value of memory component 318, word line 310(2) is connected to ground 320, and bit line 312(2) is connected to a sense amplifier 322 that applies a positive voltage, identified as +V, to the bit line 312(2). The sense amplifier 322 senses the resistance value of memory component 318 which is proportional to a signal current 324 that flows through memory component 318. The other unselected word lines (i.e., rows 310), and unselected bit lines (i.e., columns 312), do not have an equipotential voltage applied as shown in memory array 200 (FIG. 2) because the diodes in the non-selected memory cells prevent any loss of current (e.g., parasitic currents).

Figure 4:
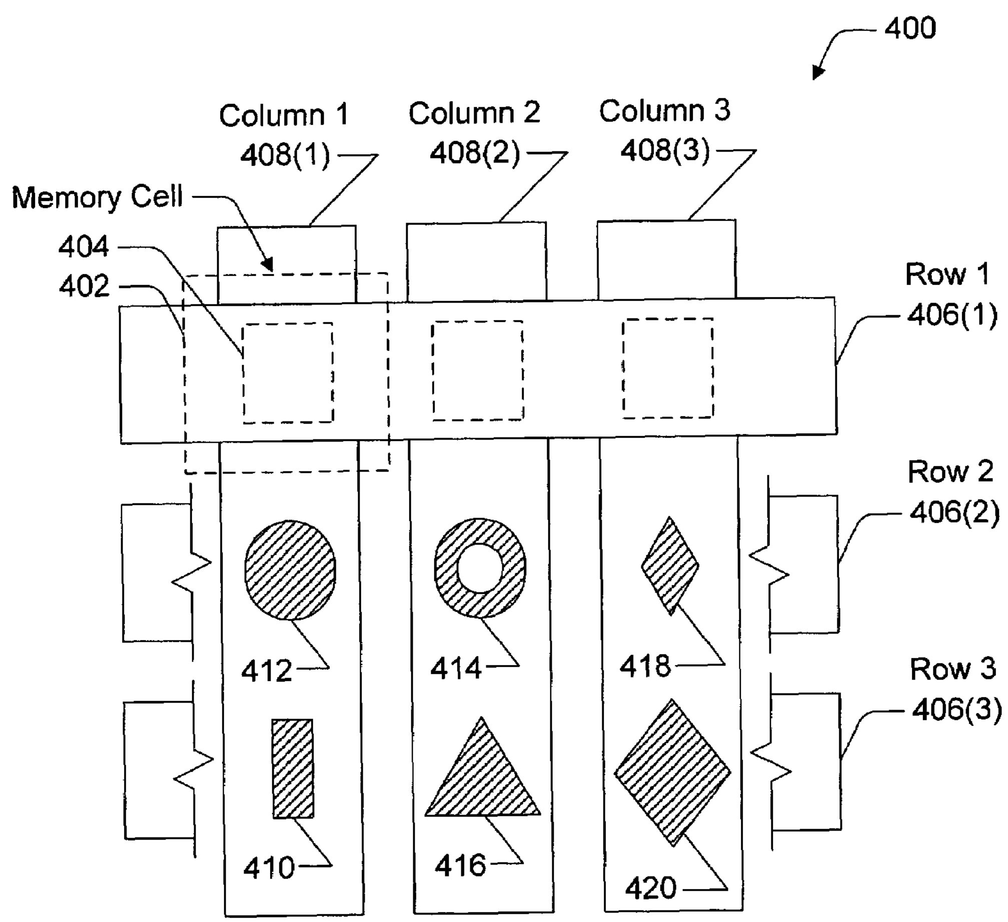
FIG. 4 illustrates a circuit diagram of a non-volatile memory array having memory cells that include resistors of varying geometric shape.

FIG. 4 is a plan view of a circuit layout for a non-volatile memory array 400 that represents one layer of a non-volatile, multi-level ROM device. An individual memory cell 402 has a memory component 404 that is connected between a row of conductive material 406(1) and a column of conductive material 408(1).

The memory cells (i.e., a memory component connected between conductive traces) include resistors having different area values that can be implemented with varying geometric shapes. Rather than varying the thickness of individual memory components to vary the resistance value of the memory components, the electrically resistive material that forms the individual memory components is formed into varying geometric shapes having different area values to vary the resistance values.

Memory array 400 includes, for example, square and rectangular memory components 404 and 410, filled and open circled memory components 412 and 414, a triangular memory component 416, and diamond shaped memory components 418 and 420. Each different geometric shape of a memory component can have a different resistance value that can be determined and correlated with multiple logical bits for a memory cell. For example, diamond shaped memory component 418 has a smaller area than diamond shaped memory component 420, and accordingly, memory component 418 has a higher resistance value than memory component 420. Those skilled in the art will recognize that any number of varying geometric shapes with different areas can be designed, from varying materials, to provide the corresponding varying resistance values to create a non-volatile memory array having memory cells with multiple logical bits.

The electrically resistive memory components of memory array 400 can be can be programmed by exposing them to varying degrees of heat or light if the memory components are formed with an electrically resistive material that is light or heat sensitive. Heat sensitive programming can be implemented by passing a current through a memory component formed with a perovskite material to alter the crystallization which changes the resistance of the memory component. Additionally, exposing a memory component formed with a perovskite compound to a laser light, or other optical device, changes the reflective state of the memory component which translates to a change in the resistive characteristics of the memory component.

Figure 5:
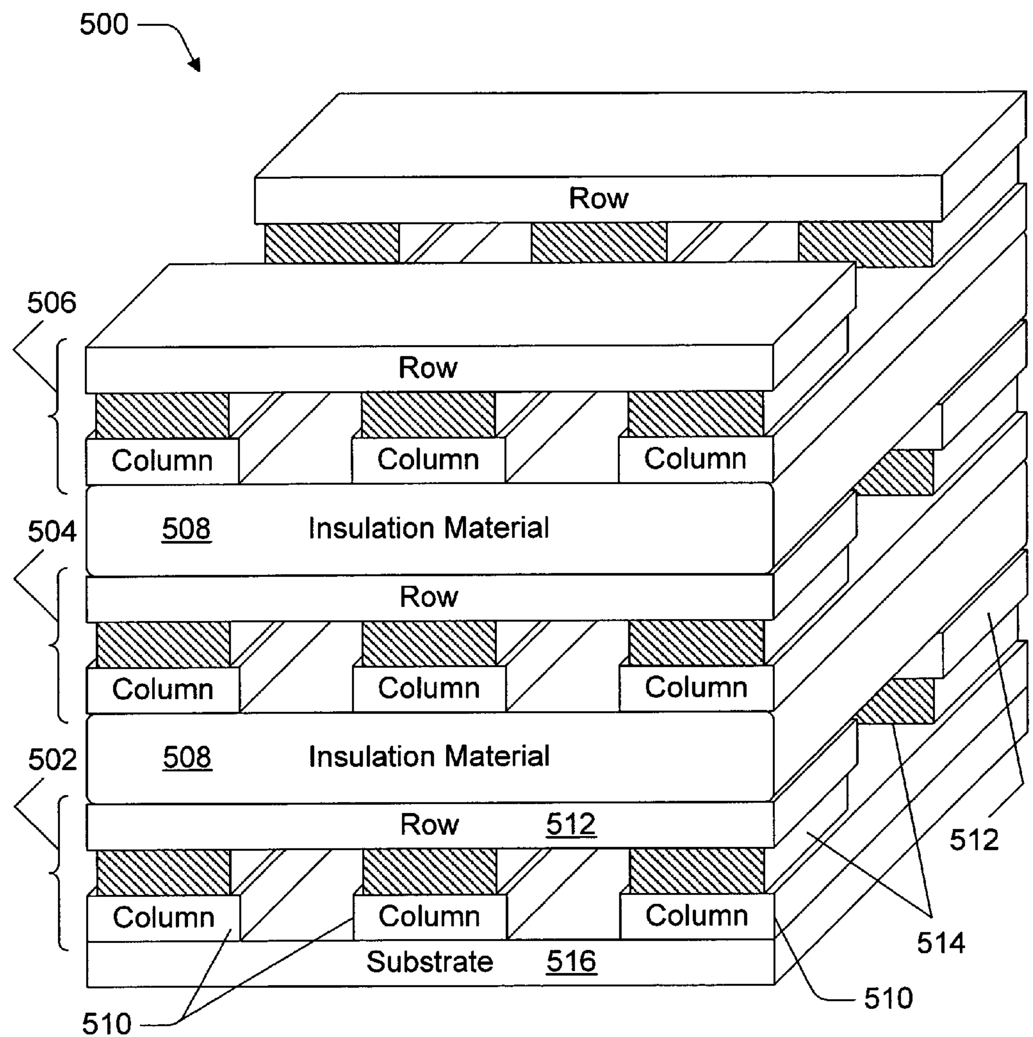
FIG. 5 illustrates a non-volatile, multi-level memory semiconductor device having electrically insulated layers.

FIG. 5 illustrates a section of a non-volatile, multi-level ROM semiconductor device 500 having electrically insulated layers 502, 504, and 506. Each layer is insulated from the next with an insulation material 508. An individual layer, such as layer 502 for example, has columns of conductive material 510, rows of conductive material 512, and memory components 514.

The first layer 502 is formed on a substrate layer 516 of the semiconductor device 500. The substrate layer 516 can be any construction of semiconductive material that is a supporting structure for the device 500. Each additional layer of the device 500 is formed on the preceding layer. For example, layer 504 is formed over layer 502, and layer 506 is formed over layer 504. Although the semiconductor device 500 is shown with only three layers, those skilled in the art will appreciate that the device can be fabricated with any number of layers, and with any number of memory cells per layer.

The columns of conductive material 510 and the rows of conductive material 512 can be fabricated with electrically conductive material such as copper or aluminum, or with alloys or doped silicon. The memory components 514 can be implemented with an electrically resistive material, such as an oxide, that forms a resistor memory component as shown in FIG. 2, or a resistor in series with a diode as shown in FIG. 3. The insulation layers 508 can be formed with a silicon dioxide material. Those skilled in the art will recognize that many different combinations of materials and designs are available to fabricate the semiconductor device 500.

Figure 6:
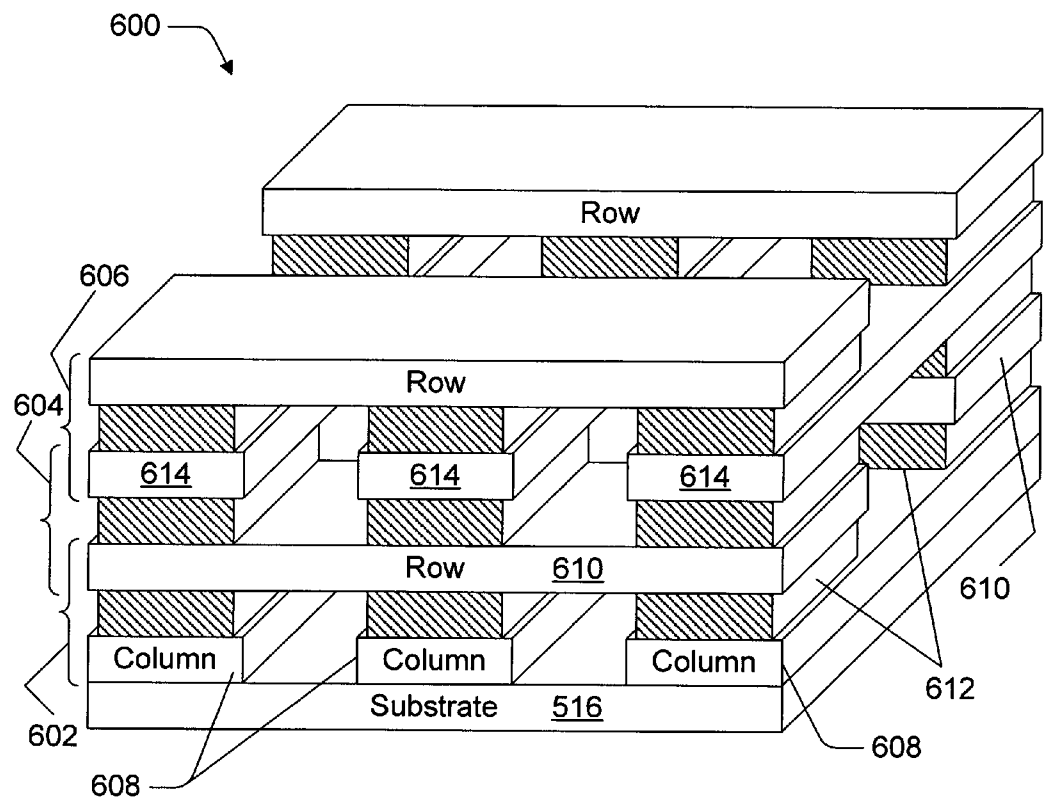
FIG. 6 illustrates a non-volatile, multi-level memory semiconductor device.

FIG. 6 illustrates a section of a non-volatile, multi-level ROM semiconductor device 600 having layers 602, 604, and 606. An individual layer, such as layer 602 for example, has columns of conductive material 608, rows of conductive material 610, and memory components 612. Each layer shares components with one or more other layers of the device 600. For example, layers 602 and 604 share common rows of conductive material 610, and layers 604 and 606 share common columns of conductive material 614.

The first layer 602 is formed on a substrate layer 516 of the semiconductor device 600. The substrate layer 616 can be any construction of semiconductive material that is a supporting structure for the device 600. Each additional layer of the device 600 is formed on the preceding layer. For example, layer 604 is formed over layer 602, and layer 606 is formed over layer 604 Although the semiconductor device 600 is shown with only three layers, those skilled in the art will appreciate that the device can be fabricated with any number of layers, and with any number of memory cells per layer.

The columns of conductive material 608, 614 and the rows of conductive material 610 can be fabricated with electrically conductive material such as copper or aluminum, or with alloys or doped silicon. The memory components 612 can be implemented with an electrically resistive material, such as an oxide. Those skilled in the art will recognize that many different combinations of materials and designs are available to fabricate the semiconductor device 600.

Figure 7:
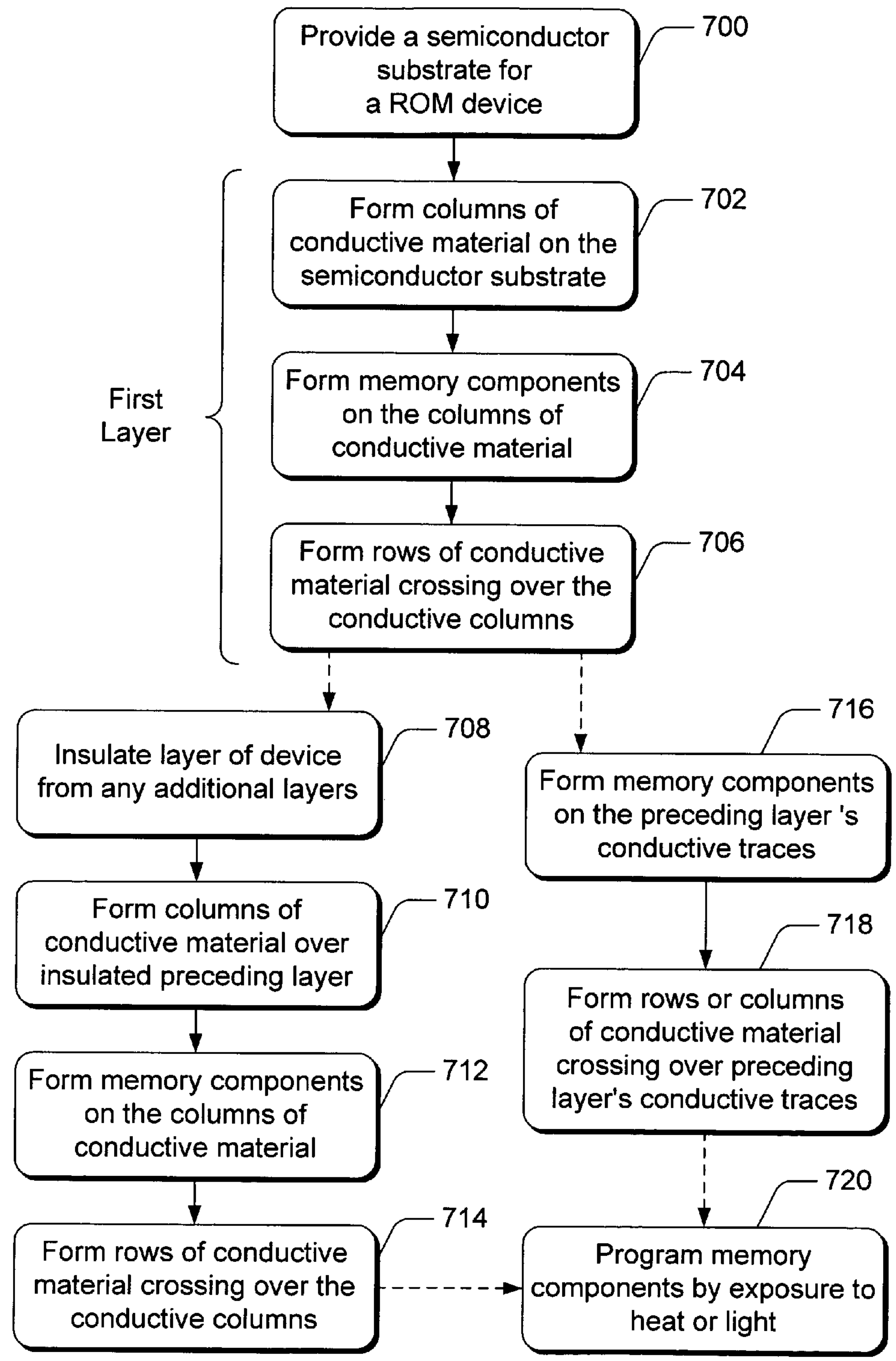
FIG. 7 is a flow diagram that describes methods for making a non-volatile, multi-level memory device.

FIG. 7 illustrates methods for making and programming a non-volatile, multi-level ROM device having memory cells that indicate multiple logical bits. The order in which the method is described is not intended to be construed as a limitation.

At block 700, a semiconductor substrate is provided upon which the multi-level ROM device is fabricated. At block 702, columns of conductive material are formed on the semiconductor substrate. The columns of conductive material are formed by either a copper damascene process, or by an aluminum or other metal deposition process.

At block 704, memory components are formed on the columns of conductive material. The memory components are formed by growth or deposition of aluminum oxide, or other similar insulating and/or tunneling material. To form a series element, a next component can be grown or deposited atop the insulating and/or tunneling barrier of the previous memory component.

At block 706, rows of conductive material are formed over the memory components such that the rows of conductive material cross over the columns of conductive material formed at block 702. The rows of conductive material are also formed by the process described to form the columns of conductive material.

An individual memory cell is created when a memory component is connected between a row of conductive material and a column of conductive material. A memory component can be formed as a resistor or as a resistor in series with a diode. The memory components can be varied in thickness or area to provide varying resistance values that correlate to multiple logical bits for a particular memory cell. Additionally, performing blocks 702 through 706 forms a first layer of a non-volatile, multi-level ROM device. Each layer of such a device includes rows of conductive material crossing over columns of conductive material, wherein a non-volatile memory cell includes connecting a memory component between a cross-point of a row of conductive material and a column of conductive material.

At block 708, an electrically insulating material is formed over the first layer to insulate the first layer from any additional layers of the multi-level ROM device. At block 710, columns of conductive material are formed on the insulating layer. At block 712, memory components are formed on the columns of conductive material. At block 714, rows of conductive material are formed over the memory components such that the rows of conductive material cross over the columns of conductive material formed at block 710. Blocks 708 through 714 are repeated for each additional layer of the memory device, such that each additional layer is formed on a preceding layer.

As an alternative to forming an insulation layer over the first layer at block 708, memory components for an additional layer are formed on the conductive traces (e.g., rows or columns) of a preceding layer at block 716. For example, memory components for a second layer are formed on the first layer's rows of conductive material formed at block 706.

At block 718, rows or columns of conductive material are formed over the memory components such that the rows or columns of conductive material cross over the conductive traces formed at block 716. For example, columns of conductive material would be formed at block 718 for a second layer, such that the columns of conductive material cross over the rows of conductive material formed at block 706. Blocks 716 and 718 are repeated for each additional layer of the memory device, such that each additional layer is formed on a preceding layer and shares components (e.g., rows or columns) of the preceding layer.

If memory components formed at blocks 704 and 712 or 716 are formed with an electrically resistive material that is light or heat sensitive, the memory components can be programmed by exposing them to varying degrees of heat or light at block 720.

A non-volatile, multi-level ROM device takes up less space than a conventional memory device, yet can provide more memory capacity. A multi-level ROM device fabricated with memory cells having resistors is inexpensive to manufacture and offers design flexibility for integrated circuit-based electronic devices. Additionally, a multi-level ROM device having multiple logical bits per memory cell provides at least double the memory capacity without increasing the size of the memory device.

Although the invention has been described in language specific to structural features and/or methodological steps, it is to be understood that the invention defined in the appended claims is not necessarily limited to the specific features or steps described. Rather, the specific features and steps are disclosed as exemplary embodiments of the claimed invention.

The invention claimed is:

1. A method, comprising:

providing a semiconductor substrate;

forming electrically conductive columns over the semiconductor substrate;

forming electrically conductive rows crossing the electrically conductive columns;

forming a plurality of memory components each having a resistance value corresponding to multiple logical bits; and forming non-volatile memory cells, each formed by connecting a memory component between an electrically conductive row and an electrically conductive column, wherein the memory components are formed to have varying resistance values based on at least one of: (1) varying thicknesses of electrically resistive materials that are part of respective memory components; (2) varying areas of electrically resistive materials that are part of respective memory components; and (3) varying geometric shapes of electrically resistive materials that are part of respective memory components.

2. A method, comprising:

providing a semiconductor substrate;

forming electrically conductive columns over the semiconductor substrate;

forming electrically conductive rows crossing the electrically conductive columns;

forming a plurality of memory components each having a resistance value corresponding to multiple logical bits; and forming non-volatile memory cells, each formed by connecting a memory component between an electrically conductive row and an electrically conductive column, wherein forming the non-volatile memory cells comprises:

forming a first memory cell having a memory component that indicates logical bits 00 (zero-zero);

forming a second memory cell having a memory component that indicates logical bits 01 (zero-one);

forming a third memory cell having a memory component that indicates logical bits 10 (one-zero); and forming a fourth memory cell having a memory component tat indicates logical bits 11 (one-one).

3. A method as recited in claim 2, wherein each memory component is formed to have a resistance value based on an area of electrically resistive material that forms an individual memory component.

4. A method as recited in claim 2, wherein each memory component is formed to have a resistance value based an a geometric shape of electrically resistive material that forms an individual memory component.

5. A method, comprising:

providing a semiconductor substrate;

forming electric ally conductive columns over the semiconductor substrate;

forming electrically conductive rows crossing the electrically conductive columns;

forming a plurality of memory components each having a resistance value corresponding to multiple logical bits; and forming non-volatile memory cells, each formed by connecting a memory component between an electrically conductive row and an electrically conductive column, wherein the plurality of memory components are each formed to have a resistance value based on a rectangular geometric shape of electrically resistive material that forms a memory component, at least some of the rectangular geometric shapes having different resistance values corresponding to an area of a rectangular geometric shape.

6. A method, comprising:

providing a semiconductor substrate;

forming electrically conductive columns over the semiconductor substrate;

forming electrically conductive rows crossing the electrically conductive columns;

forming a plurality of memory components each having a resistance value corresponding to multiple logical bits; and fanning non-volatile memory cells, each formed by connecting a memory component between an electrically conductive row and an electrically conductive column, wherein forming the non-volatile memory cells comprises:

forming a first memory cell that indicates logical bits 00 (zero-zero) corresponding to a first resistance value based on an area of electrically resistive material that forms a memory component in the first memory cell;

forming a second memory cell tat indicates logical bits 01 (zero-one) corresponding to a second resistance value based on an area of electrically resistive material tat forms a memory component in the second memory cell;

forming a third memory cell that indicates logical bits 10 (one-zero) corresponding to a third resistance value based on an area of electrically resistive material that forms a memory component in the third memory cell; and forming a fourth memory cell tat indicates logical bits 11 (one-one) corresponding to a fourth resistance value based on an area of electrically resistive material that forms a memory component in the fourth memory cell.

7. A method, comprising:

providing a semiconductor substrate;

forming electrically conductive columns over the semiconductor substrate;

forming electrically conductive rows crossing the electrically conductive columns;

forming a plurality of memory components each having a resistance value corresponding to multiple logical bits; and forming non-volatile memory cells, each formed by connecting a memory component between an electrically conductive row and an electrically conductive column, wherein the non-volatile memory cells are formed without transistors for reduced space usage on the semiconductor substrate by each memory cell, wherein forming the non-volatile memory cells comprises:

forming a first non-volatile memory cell by connecting a first memory component between an electrically conductive row and a first electrically conductive column, the first non-volatile memory cell formed as part of a first layer of non-volatile memory cells; and forming a second non-volatile memory cell by connecting a second memory component between the electrically conductive row and a second electrically conductive column, the second non-volatile memory cell formed as part of a second layer of non-volatile memory cells, the second layer formed over the first layer.

8. A method as recited in claim 7, wherein forming the plurality of memory components comprises forming individual memory components with a resistor in series with a diode.

9. A method as recited in claim 7, further comprising configuring the resistance value of an individual memory component by exposing the memory component to light.

10. A method as recited in claim 7, further comprising configuring the resistance value of an individual memory component by exposing electrically resistive material forming the memory component to light.

11. A method as recited in claim 7, further comprising configuring the resistance value of an individual memory component by exposing the memory component to heat.

12. A method as recited in claim 7, further comprising configuring the resistance value of an individual memory component by exposing electrically resistive material forming the memory component to heat.

13. A method comprising:

providing electrically conductive row traces and electrically conductive column traces;

providing memory cells having respective resistive components, the resistive components connected between respective row and column traces without connecting through isolation circuitry, an individual one of the resistive components having a resistance value representing plural logical bits, wherein providing the memory cells having respective resistive components connected between respective row and column traces without passing through isolation circuitry comprises providing the memory cells having respective resistive components connected between respective row and column traces without passing through transistors or diodes.

14. The method of claim 13, further comprising:

connecting a selected one of the column traces to a first voltage;

connecting a selected one of the row traces to a second voltage such that electrical current passes through a selected memory cell; and connecting unselected column and row traces to voltages generally equal to the first voltage to reduce parasitic electrical current through unselected memory cells.

15. The method of claim 14, wherein connecting the selected row trace to the second voltage comprises connecting the selected row trace to ground.

16. A method comprising:

providing electrically conductive row traces and electrically conductive column traces;

providing memory cells having respective resistive components, the resistive components connected between respective row and column traces without connecting through isolation circuitry, an individual one of the resistive components having a resistance value representing plural logical hits, wherein providing the memory cells comprises providing the memory cells in at least a first layer and a second layer, the first layer being provided ova the second layer.

17. A method comprising:

providing electrically conductive row trace electrically conductive column traces;

providing memory cells having respective resistive components, the resistive components connected between respective row and column traces without connecting through isolation circuitry, an individual one of the resistive components having a resistance value representing plural logical bits, wherein providing the memory cells having respective resistive components comprises providing resistive components having varying resistance values based on at least one of; (1) varying thicknesses of electrically resistive materials that are part of respective resistive components; (2) varying areas of electrically resistive materials that are part of respective resistive components; and (3) varying geometric shapes of electrically resistive materials that are part of respective resistive components.

* * * * *

UNITED STATES PATENT AND TRADEMARK OFFICE

CERTIFICATE OF CORRECTION

PATENT NO. : 7,019,381 B2
APPLICATION NO. : 10/611544
DATED : March 28, 2006
INVENTOR(S) : Kenneth K. Smith et al.

It is certified that error appears in the above-identified patent and that said Letters Patent is hereby corrected as shown below:

In column 4, line 51, delete “Hewleft-Packard” and insert -- Hewlett-Packard --, therefor.

In column 8, line 67, in Claim 2, delete “tat” and insert -- that --, therefor.

In column 9, line 6, in Claim 4, delete “an a” and insert -- on a --, therefor.

In column 9, line 11, in Claim 5, delete “electric ally” and insert -- electrically --, therefor.

In column 9, line 37, in Claim 6, delete “fanning” and insert -- forming --, therefor.

In column 9, line 46, in Claim 6, delete “tat” and insert -- that --, therefor.

In column 9, line 48, in Claim 6, delete “tat” and insert -- that --, therefor.

In column 9, line 55, in Claim 6, delete “tat” and insert -- that --, therefor.

In column 11, line 10, in Claim 16, delete “hits” and insert -- bits --, therefor.

In column 11, line 13, in Claim 16, delete “ova” and insert -- over --, therefor.

In column 11, line 16, in Claim 17, delete “trace” and insert -- traces and --, therefor.

In column 12, line 10, in Claim 17, delete “one of;” and insert -- one of: --, therefor.

Signed and Sealed this

Twenty-third Day of June, 2009

John Doll

JOHN DOLL
*Acting Director of the United States Patent and Trademark Office*